(12) United States Patent
Frolov et al.

(10) Patent No.: US 10,790,402 B2
(45) Date of Patent: Sep. 29, 2020

(54) DEGRADATION-RESISTANT PHOTOVOLTAIC DEVICES

(71) Applicant: Sunlight Aerospace Inc., Edison, NJ (US)

(72) Inventors: Sergey Frolov, Murray Hill, NJ (US); Allan James Bruce, Scotch Plains, NJ (US); Michael Cyrus, Castle Rock, CO (US)

(73) Assignee: SUNLIGHT AEROSPACE INC., Edison, NJ (US)

( * ) Notice: Subject to any disclaimer, the term of this patent is extended or adjusted under 35 U.S.C. 154(b) by 0 days.

(21) Appl. No.: 15/928,338

(22) Filed: Mar. 22, 2018

(65) Prior Publication Data
US 2018/0309001 A1    Oct. 25, 2018

Related U.S. Application Data

(63) Continuation of application No. 12/572,976, filed on Oct. 2, 2009, now abandoned.

(51) Int. Cl.
| | |
|---|---|
| *H02N 6/00* | (2006.01) |
| *H01L 31/042* | (2014.01) |
| *H01L 31/046* | (2014.01) |
| *H01L 31/0463* | (2014.01) |

(52) U.S. Cl.
CPC ........ *H01L 31/046* (2014.12); *H01L 31/0463* (2014.12); *Y02E 10/50* (2013.01)

(58) Field of Classification Search
CPC ............. H01L 31/0352; H01L 31/0463; H01L 31/0465; H01L 31/0508; H01L 31/046
USPC ......................................... 136/244, 252, 256
See application file for complete search history.

(56) References Cited

U.S. PATENT DOCUMENTS

| | | | | |
|---|---|---|---|---|
| 5,593,901 A | * | 1/1997 | Oswald | ........... H01L 31/022425 |
| | | | | 136/244 |
| 2009/0288696 A1 | * | 11/2009 | Kim | ................ H01L 31/035281 |
| | | | | 136/244 |

* cited by examiner

*Primary Examiner* — Angelo Trivisonno
(74) *Attorney, Agent, or Firm* — Stuart H. Mayer; Mayer & Williams PC

(57) ABSTRACT

A degradation-resistant photovoltaic device is provided. The device includes an active area and at least one photovoltaic cell located in the active area. The photovoltaic cell has an elongated shape with a characteristic width and a characteristic length. The characteristic length is greater than the characteristic width and an average distance from the photovoltaic cell to any edge of the active area is greater than the characteristic width.

19 Claims, 6 Drawing Sheets

DEGRADATION-RESISTANT PHOTOVOLTAIC DEVICES

FIELD OF THE INVENTION

The following relates generally to photovoltaic devices, and more particularly to degradation and moisture resistant photovoltaic devices and methods of producing the same.

BACKGROUND OF THE INVENTION

One of the major contributors to current worldwide generation of renewable energy is the solar energy produced via a photovoltaic (PV) effect. PV-based renewable-energy sources generate energy, in the form of electricity, by harnessing electromagnetic radiation, such as sunlight. PV applications are not limited to any particular area of the world and/or any given sector of economy. In remote regions of the world, for example, an off-grid installation of the PV source provides the only available source of electricity. In highly populated and/or economically developed regions, the PV source may, for example, source electricity to an electrical grid to supplement and/or reduce the amount of conventional energy distributed from the electrical grid. A PV source is in general any electric system containing a PV device, such as a PV cell or a PV module.

PV devices are typically used outdoors, and are therefore exposed to the elements, including wind, water and sunlight. They are known to be susceptible to degradation of performance when exposed to extreme temperatures, rain or snow, atmospheric humidity, contaminant gases and atmospheric oxygen. In general, degradation depends on multiple factors, including PV cell design, module construction, material types and packaging. Accordingly, field-aged modules exhibit degradation of packaging materials, adhesion losses, degradation of interconnects, degradation due to moisture intrusion and semiconductor device degradation.

Thin film PV (TFPV) modules are deleteriously affected in particular by moisture that may permeate into the module, reaching the electrical connections or the semiconductor materials. For example, if the front and back substrates are moisture impermeable, the primary path for water to enter the module is through the edges of a module if they are permeable. Water penetration into solar modules has been a long-standing problem in the industry.

Different means have been used to reduce or completely eliminate this problem. For example, in some studies special water-impermeable polymers have been proposed to increase moisture diffusion time and thus increase module's lifetime. In addition, certain design features have been proposed that also achieve similar goals. For example, U.S. Pat. No. 4,578,526 to Nakano et al. teaches ways to improve the durability of TFPV devices based on CdTe by offsetting the active PV materials from the edge of the glass substrate to provide a border area for extra moisture protection. This however reduces the active area of a PV device and lowers its total output power.

SUMMARY OF THE INVENTION

In accordance with the present invention, a degradation-resistant photovoltaic device is provided. The device includes an active area and at least one photovoltaic cell located in the active area. The photovoltaic cell has an elongated shape with a characteristic width and a characteristic length. The characteristic length is greater than the characteristic width and an average distance from the photovoltaic cell to any edge of the active area is greater than the characteristic width.

In accordance with another aspect of the invention, a degradation-resistant photovoltaic device is provided which includes an active area characterized by a degradation depth extending from any edge of the active area. The degradation depth is equal to a lateral extent of performance degradation arising from environmental factors over a period of time about equal to a projected lifetime of the photovoltaic device. The photovoltaic device also includes at least one photovoltaic cell having an elongated shape and which is located in the active area. An average distance from the photovoltaic cell to any edge of the active area is greater than the degradation depth.

In accordance with another aspect of the invention, a degradation-resistant photovoltaic device includes an active area and a plurality of photovoltaic cells and a plurality of electrical contacts located within the active area. The contacts are connected to at least one of the cells and have an elongated shape with a characteristic width and a characteristic length. The characteristic length is greater than the characteristic width and an average distance from any of the contacts to any edge of the active area is greater than its characteristic width.

DETAILED DESCRIPTION OF THE INVENTION

In the following detailed description, numerous specific details are set forth in order to provide a thorough understanding of exemplary embodiments or other examples described herein. However, it will be understood that these embodiments and examples may be practiced without the specific details. In other instances, well-known methods, procedures, components and circuits have not been described in detail, so as not to obscure the following description. Further, the embodiments disclosed are for exemplary purposes only and other embodiments may be employed in lieu of, or in combination with, the embodiments disclosed.

Figure 1:
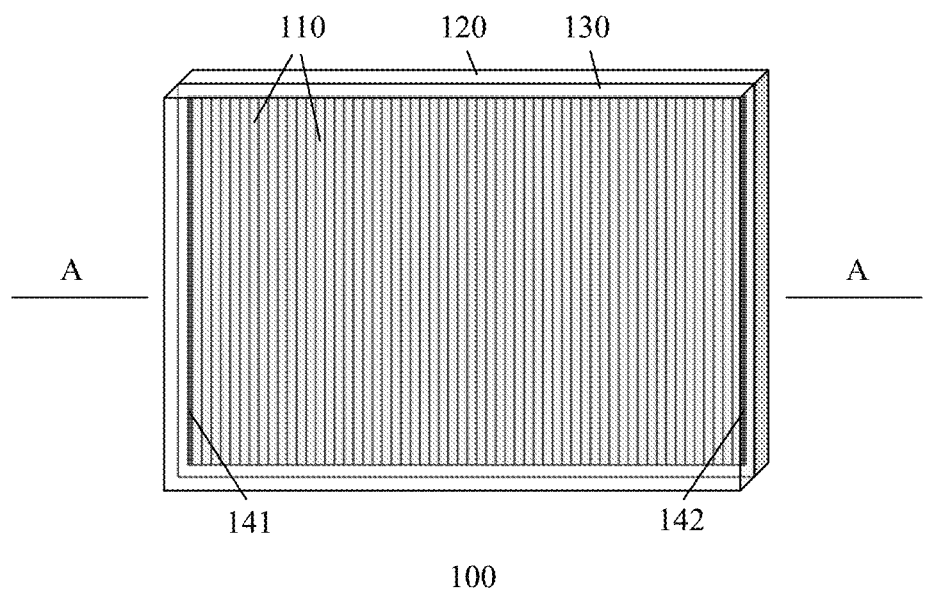
FIG. 1 shows a thin-film photovoltaic module.
Figure 2:
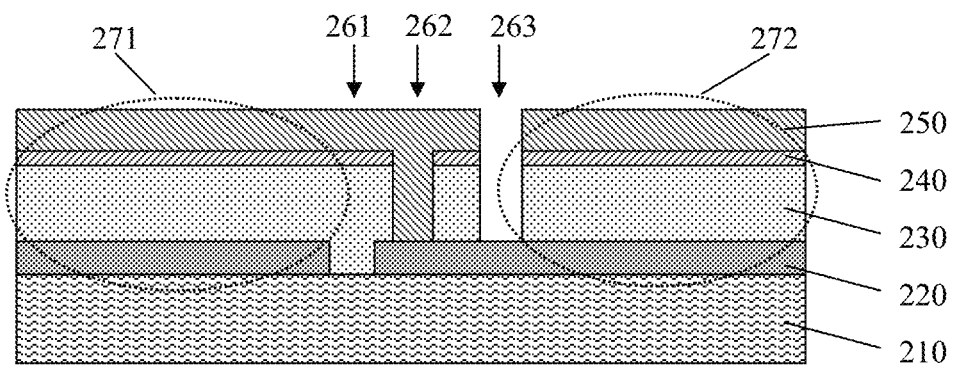
FIG. 2 shows a cross-section of the thin-film photovoltaic module shown in FIG. 1.

A thin-film photovoltaic (TFPV) module 100 shown in FIG. 1 comprises photovoltaic (PV) cells 110 connected in series, terminated by electrical contacts 141 and 142, and encapsulated between two glass substrates 120 and 130. FIG. 2, which is a cross-sectional view of the module 110 shown in FIG. 1 taken along a horizontal line AA therethrough, shows one example of how the individual PV cells may be produced on a single substrate 210. In particular, the following layers are sequentially deposited on the substrate 210: first contact layer 220, absorber layer 230, window layer 240 and second contact layer 250. Substrate 210 may correspond to one of substrates 120 and 130 shown in FIG. 1, or alternatively, substrate 210 may be a different substrate made of an appropriate material, such as glass, stainless steel, polyimide or other. First contact layer 220 may be for example a thin (0.1-1 μm) transparent conducting oxide (TCO), such as tin oxide ($SnO_2$), or thin metal, such as molybdenum (Mo). The absorber layer 230 may be a thin (about 1-20 μm) layer of polycrystalline or amorphous semiconductors, such as amorphous silicon alloys, cadmium telluride (CdTe), copper-indium-gallium-selenide (CIGS) alloys, conducting polymers and others. Thin window layer 240 may be produced using CdS, ZnS or ZnO. Second contact layer 250 may be produced using metallic layers or transparent conductors, such as indium-tin oxide (ITO), aluminum doped zinc oxide (AZO) and others.

For monolithic interconnection, layers 220, 230, 240 and 250 may be divided into separate cells and interconnected in series using a series of mechanical and laser scribing steps to produce scribing lines 261, 262 and 263 between the deposition steps forming the back contact, absorber, window and top contact layers, respectively, as shown in FIG. 2. In this way two individual cells 271 and 272 are formed in the example of FIG. 2, one to the left of the scribing lines and the other to the right of the scribing lines. Additional series of scribing lines may be added to form the series of individual cells shown in FIG. 1.

It should be emphasized that the present invention is not limited to individual cells that are formed in the manner described above. For instance, the individual cells do not need to be formed from a single large thin film as shown in FIG. 2. Rather, each cell may be formed separately from the others and monolithically integrated by any appropriate means. In other words, the photovoltaic cells may be prefabricated and then physically arranged on a substrate. In addition, the composition of the cells and/or the processes used to form them may differ for different cells in the same module.

A major challenge for thin-film PV materials is that they degrade rapidly in the presence of minute concentrations of moisture or reactive gases, such as oxygen, typical for most applications. This results in a large reduction in efficiency and a large change in the optimum load impedance during the operational lifetime of a PV module. PV material degradation typically includes degradation of transparent conducting layers, such as AZO, degradation of absorber layers, such as a-Si or CIGS, adhesion loss between layers and junction degradation. Most of the material degradation occurs around the edges of the module, so that individual cells 110 closest to edge contacts 141 and 142 are degraded at a much faster rate as compared to that of the cells closer to the center of module 100. Since all cells 110 are connected in series and a failure in any one of them results in a failure of the whole module, the rate of module degradation is determined by the degradation rate of the weakest cells, i.e. those cells that are closer to the edges.

Figure 3:
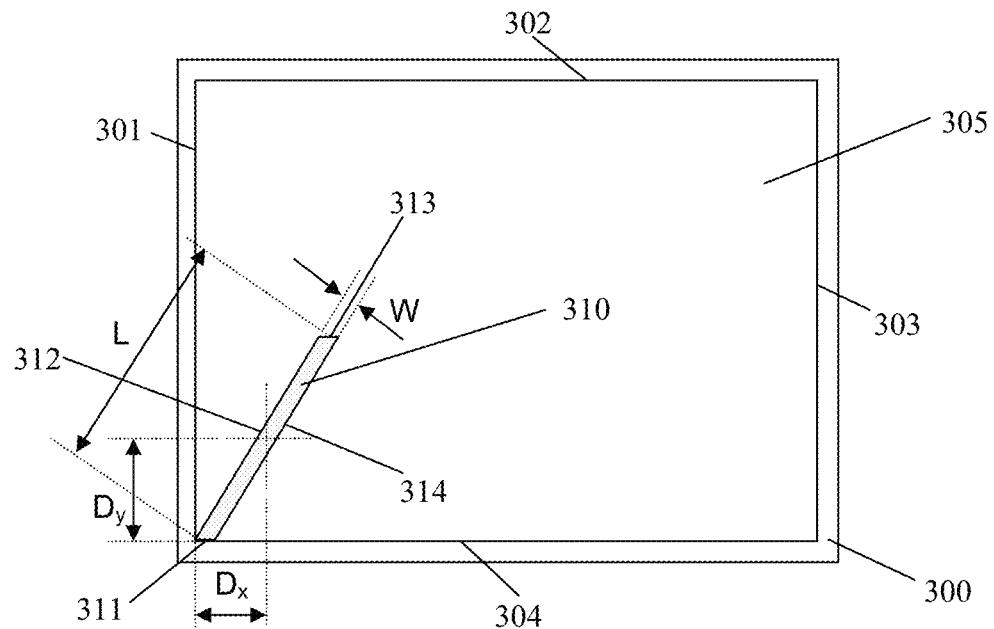
FIG. 3 shows an active area of failure resistant photovoltaic module with a straight cell.

In accordance with the present invention, FIG. 3 shows an active area 305 of PV module 300, which includes at least one PV cell 310. The active area of a PV module is the area that contains PV materials and that is exposed to sunlight. In this case area 305 is defined by edges 301, 302, 303 and 304. Other area shapes and forms may be used, for example triangular, trapezoidal, polygonal, circular and others. Correspondingly, the active area edges may be straight or curved and their number may vary. In the simplest case, the area shape is rectangular and therefore, it has four straight sides as shown in FIG. 3. The edges 301, 302, 303 and 304 may correspond to the edges of the module 300 or may be recessed inside the edges of the modules 300 as shown in FIG. 3.

The single PV cell 310 shown in FIG. 3 has an area that is smaller than the active area 305. Furthermore, PV cell 310 has an elongated shape with a characteristic length L, where L is the largest extension of the cell in one of the directions in the plane of the module. Also, PV cell 310 has a characteristic width W, which is the average size of the cell in the direction orthogonal to its length. PV cell 310 is defined or positioned inside the active area 305 so that the average distances from the cell 310 to all the edges of the active area 301, 302, 303 and 304 are greater than W. For example, the average distance between cell 310 and edge 301 is denoted as $D_x$ in FIG. 3. Thus, $D_x$ should be greater than W and preferably should be substantially greater than W. Similarly, the average distance between cell 310 and edge 304 is denoted $D_y$, which also should be greater than W and preferably should be substantially greater than W. As a result, only a small portion of PV cell 310 is close to any of the active area edges, where it will be subjected to edge-related degradation. If only this relatively small portion of the cell is degraded, the performance of the whole cell will only be reduced by a corresponding small amount.

PV cell 310 may have edges or sides 311, 312, 313 and 314, the total length of which equals the perimeter of the cell. Generally, the edges of the cell delineate its boundary and may be correspond to either cutting or scribing lines; such lines may be straight or curved depending on the cell layout. Some of the cell's edges may be located close or substantially on the edge of the active area, as for example is the case for side 311 of cell 310. In this case, the length of side 311 is substantially smaller that the cell's perimeter. In order to increase degradation resistance of a module, it could be designed so that the length of any side of any cell adjacent to the edge of the active area in such a module is substantially less than the perimeter of a given cell, preferably less than one fourth of the perimeter and more preferably less than one tenth of the perimeter. As a result, only a small portion of any cell is subjected to the edge-related degradation.

Figure 4:
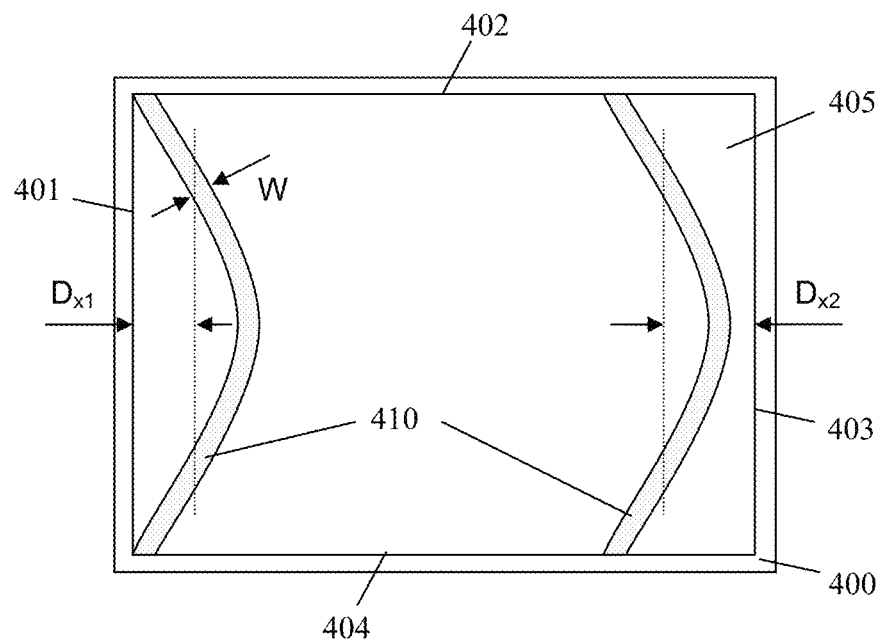
FIG. 4 shows an active area of failure resistant photovoltaic module with a curved cell.

Similarly, FIG. 4 shows an active area 405 of PV module 400 defined by edges 401, 402, 403 and 404, which includes at least one PV cell 410. PV cells 410 have an elongated shape characterized by an average width W. This shape is selected so that the average distance between the cells and any of the edges 401, 402, 403 and 404 is larger than W. For example, the average distance to edge 401, once again denoted $D_{x1}$, is greater than W and the average distance to edge 403, once again denoted $D_{x2}$, is greater than W. As a result, only a small fraction of PV cells 410 are close to any of the active area edges and thus subject to edge-related degradation.

Figure 5:
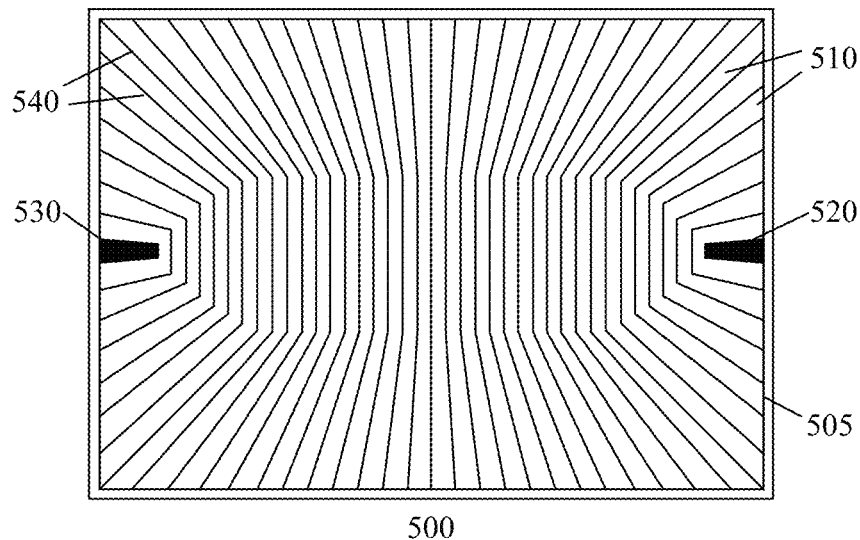
FIG. 5 shows a failure-resistant thin-film photovoltaic module with straight scribing lines.

In accordance with another aspect of invention, FIG. 5 shows an active area 505 of a PV module 500, which comprises a plurality of PV cells 510 and electrical contacts 520 and 530. PV cells 510 are elongated, nonrectangular and positioned inside the active area 505 so that the distance between any of the cells and any of the active area edges is larger than the average width of the cells. PV cells 510 and the two electrical contacts 520 and 530 are connected electrically in series. The cells 510 may have different polygonal shapes as defined by scribing lines 540. Scribing lines 540 may contain straight sections and have non-repeating patterns. Scribing lines may be produced by laser scribing, mechanical scribing, cutting, photolithographic patterning and etching. Only small parts of PV cells 510 and electrical contacts 520 and 530 are close to the edges of the active area 505 and therefore, the degradation rate of module 500 is reduced compared to that of module 100 shown in FIG. 1, which has regularly defined rectangular PV cells 110.

Figure 6:
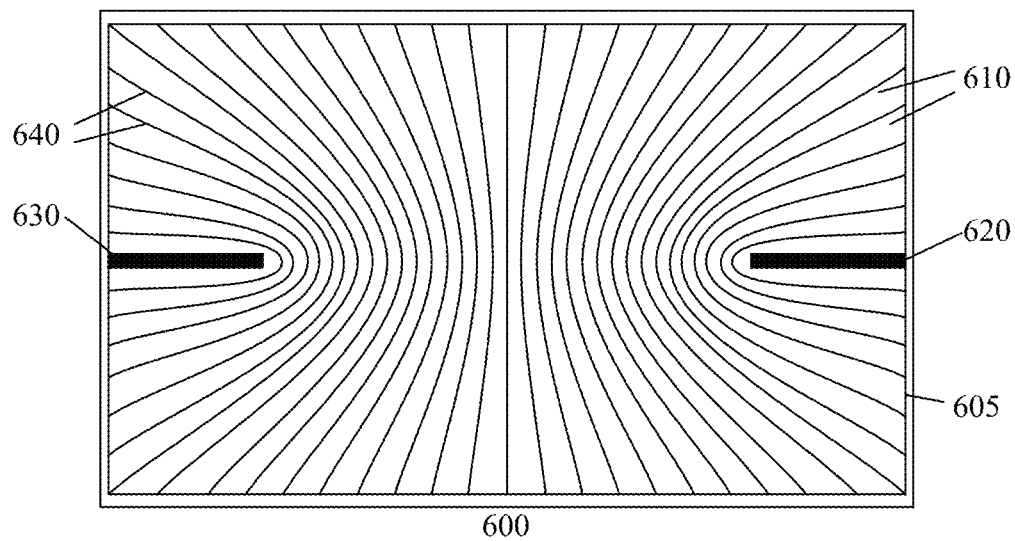
FIG. 6 shows a failure-resistant thin-film photovoltaic module with curved scribing lines.

Similarly, in another example, FIG. 6 shows an active area 605 of a PV module 600, which comprises a plurality of PV cells 610 and electrical contacts 620 and 630. PV cells 610 are elongated, nonrectangular and positioned inside the active area 605 so that the distance between any of the cells and any of the active area edges is larger than the average width of the cells. The characteristic length of the cells 610 may be about the same as either the width or the length of the whole module 600. PV cells 610 and the two electrical contacts 620 and 630 are connected electrically in series. The cells 610 may have different smoothly curved shapes as defined by scribing lines 640. Scribing lines 640 may contain curved sections and have non-repeating patterns. Scribing lines may be produced by laser scribing, mechanical scribing, cutting, photolithographic patterning and etching. Only small parts of PV cells 610 and electrical contacts 620 and 630 are close to the edges of the active area 605 and therefore, the degradation rate of module 600 is reduced compared to that of module 100 with regularly defined rectangular PV cells 110.

Figure 7:
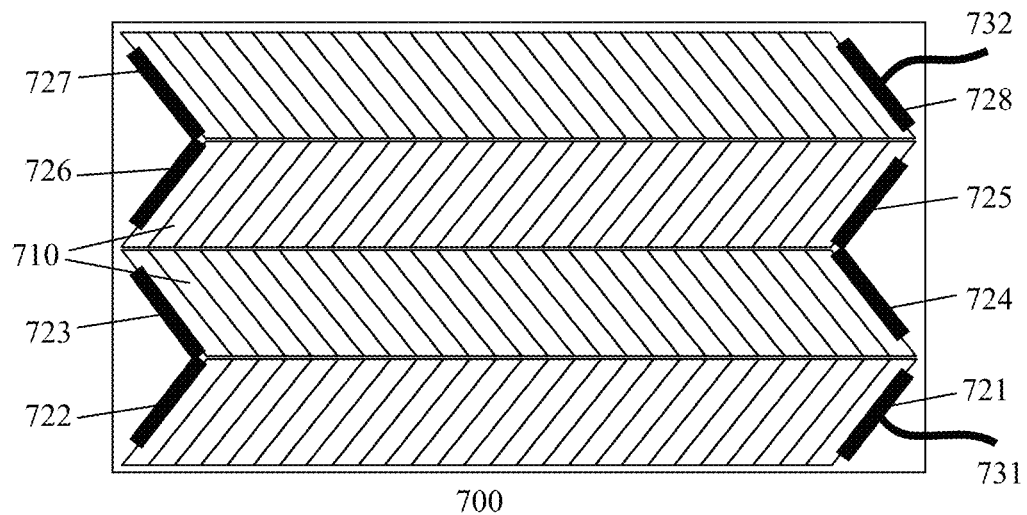
FIG. 7 shows a failure-resistant photovoltaic module with hybridly integrated cells.

In accordance with another aspect of invention, FIG. 7 shows PV module 700, which comprises a plurality of PV cells 710. PV cells 710 may be elongated and positioned in such a way, so that most of their area is substantially removed from the edges of the module and the average distance between each cell 710 and any of the module edges is larger than the characteristic width of the PV cell. The characteristic length of the PV cells 710 may be less than either the length or the width of the module 700. The shape of the cells may be a rectangle or a parallelogram, which is elongated in the direction having an angle greater than 0 and less than 90 degrees with any of the edges of the modules 700. There may be additional electrical contacts or pads 721-728. These contacts and cells 710 are electrically connected in series and terminated by electrical terminals 731 and 732, where pads 722 and 723, 724 and 725, 726 and 727 may be connected to each other in pairs, respectively.

Figure 9:
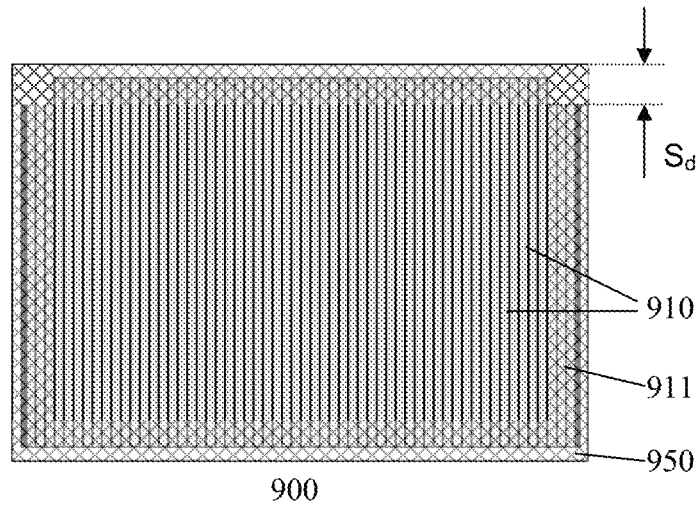
FIG. 9 shows the degradation area of a thin-film photovoltaic module.

The edge-related degradation, such as moisture degradation, may be characterized by the degradation depth $S_d$ as shown in FIG. 9. PV module 900, comprising PV cells 910, may develop an area 950 around the edges, where PV materials and their performance are degraded. The characteristic width of this area $S_d$ may depend on the properties of the PV materials and environmental conditions. In general, this width increases with time and aging of the module. $S_d$ may be specified as the end-of-life (10-20 years) value of the degradation depth. PV cells 911 that are closest to the edges and less than a distance $S_d$ from an edge will experience more pronounced degradation compared to that of the cells farther away from the edges.

Figure 10:
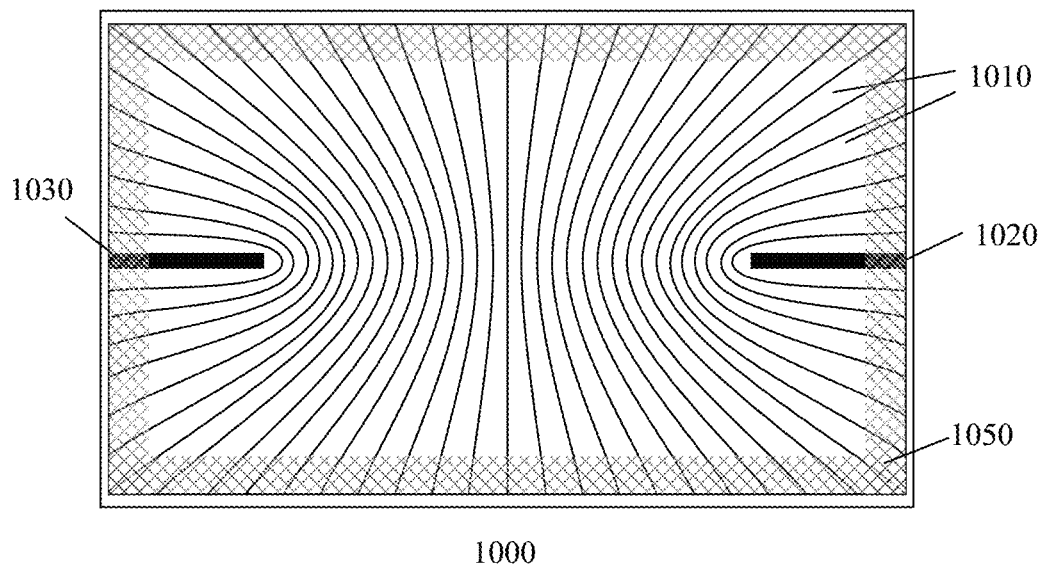
FIG. 10 shows the degradation area of a degradation-resistant photovoltaic module.

Degradation-resistant module 1000 shown in FIG. 10 may develop with age an area 1050 (having a characteristic width $S_d$) around its edges with degraded performance. In this example PV cells 1010 are arranged in a pattern similar to that of module 600 shown in FIG. 6. In this case degradation is shared substantially equally among different PV cells 1010, since only a small fraction of each cell is within area 1050. Similarly, only a small fraction of electrical contacts 1020 and 1030 is within area 1050. The average distance between any of the cells and any of the edges is greater than $S_d$ and similarly, the average distance between any of the electrical contacts and any of the edges is also greater than $S_d$. This design leads to a longer operational life of the module.

Typically, a solar module is expected to have an operational lifetime of at least 5-10 years. Manufacturers provide product warranties up to 20-25 years, which specify that solar modules will produce no less than 80% of its specified peak power output for the time of the warranty. Projected lifetime of a module therefore may vary from 5 to 25 years depending on its manufacturer. The lifetime of the module is primarily determined by the degradation of its performance, i.e. a gradual or sudden decrease in its output characteristics such as output power, voltage, current and efficiency when measured under the standard test conditions (STC). A substantial portion of such degradation occurs around the edges of a module. Edge-related degradation of the module and its magnitude, as expressed by the degradation depth $S_d$, can be evaluated in a number of ways. For example, a visual inspection of the active area of a module may reveal discoloration and delamination of PV materials around the edges, the size of which would provide a direct measurement of $S_d$. Also, testing the performance of a module in STC and measuring its peak output power or maximum conversion efficiency may also provide a quantitative measure of $S_d$. For example, 10% decrease in efficiency of module 1000 may indicate that approximately 10% of its active area is degraded, which for a 1 m×2 m module corresponds to $S_d$ of about 3 cm. Thus, the degradation depth of a module at the end of its operational lifetime could be approximately evaluated by calculating $S_d$, at which the efficiency is degraded by a specified amount, e.g. by 20%. These projections and calculations can be verified in accelerated aging tests, which simulate the aging and degradation of a device during its multi-year life span in a much shorter time using excess heat and humidity.

In accordance with yet another aspect of invention, a failure-resistance module may include multiple layers of PV cells interposed on top of each other. The top layers may be partially transparent and allow a portion of the light to be transmitted to and absorbed by PV cells in the underlying layers. The operation of such a module may be similar to that of a multi-junction solar cell or module. The shape and position of each cell in each layer of such a module are chosen so that the average distance between any cell and any of the module edges is greater and preferably much greater than the cell's characteristic width.

Example 1

Figure 8:
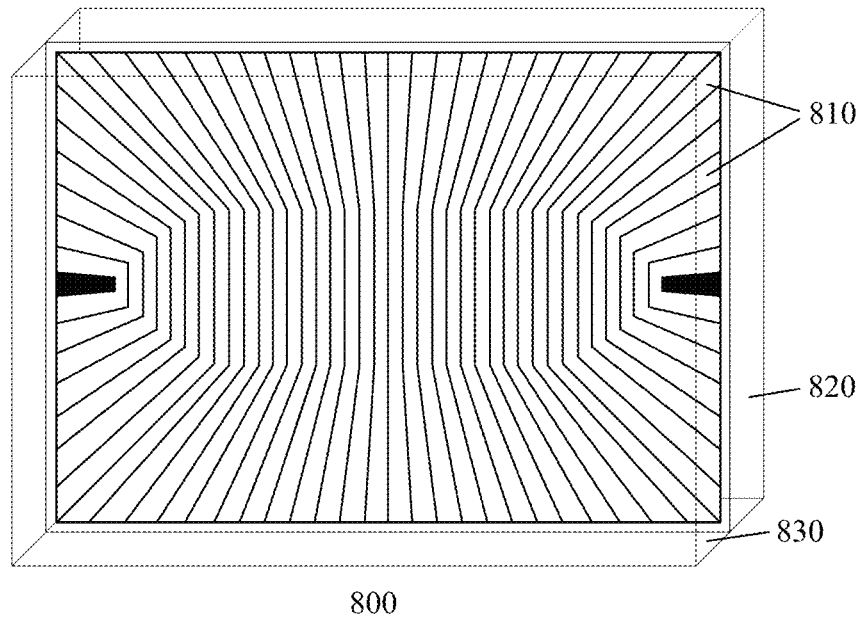
FIG. 8 shows an enclosed failure-resistant photovoltaic module.

A failure-resistant TFPV module 800 may be produced as shown in FIG. 8, in which PV cells 810 are sandwiched between two glass substrates 820 and 830. The width of the modules may be about 10-60 cm, the length of the module may be about 20-120 cm and the thickness of the module without a frame may be 1-15 mm. The PV cells may be CIGS cells monolithically interconnected in series by scribing; alternatively, the cells may be based on a-Si or CdTe. In the CIGS cell production, a first Mo layer 0.5-1 µm thick is deposited onto soda lime glass substrate 820 and then laser-scribed to isolate the back contacts of the individual cells (P1 scribe). The scribing pattern shown in FIG. 8 is such that each cell has limited proximity to the edges of the module. Subsequently, a CIGS layer 1-3 μm thick is deposited onto the Mo layer and followed by thin layers (10-100 nm) of CdS and ZnO. These layers are then mechanically scribed (P2 scribe) alongside the laser scribing lines following the P1 scribe pattern. Finally, an Al-doped ZnO (AZO) layer is deposited and then scribed (P3 scribe) to produce a string of interconnected CIGS cells. The scribing pattern is designed so that the average width of the PV cell is about 5-20 mm. Furthermore, an antireflective coating may be deposited to reduce the amount of reflected light and thus increase the module efficiency. The top glass cover substrate 830 may be vacuum-laminated with the substrate 820 using ethylene vinyl acetate (EVA) or other thermoplastic. The module may also have a junction box on its backside with electrical connections to PV cells 810.

Example 2

Another failure-resistant TFPV module may be produced in which PV cells are sandwiched between two substrates. The PV cells may be CIGS cells produced separately from each other on a flexible substrate, such as polyimide, stainless steel or aluminum foil. These PV cells may be elongated and laid out in this TFPV module similar to the way cells 710 are laid out in module 700, so that a minimal part of cell area is near any of the edges. The cells are interconnected either in parallel or in series using additional electrical contacts, e.g. metal tabs, solder or conducting ink. The top and bottom substrates are laminated together to completely enclose the PV cells. The top cover substrate may be made from glass, e.g. tempered glass. The bottom substrate may be made from metal foil, plastic such as tedlar or composite laminate materials.

Example 3

Another failure-resistant TFPV module may be produced in which multi junction PV cells are sandwiched between two substrates. The PV cells may be based on CIGS or a-Si alloys and include two or more pn junctions. Top junctions are characterized by absorber semiconductors with larger bandgaps compared to that of the lower junctions. These multi-junction cells are monolithically interconnected in series by scribing. The scribing pattern may be similar to the pattern shown in FIG. 8, so that each cell is substantially removed from the edges of the module. The scribing pattern is designed so that the average width of the PV cell is about 1-30 mm. The top and bottom substrate are laminated together to completely enclose the PV cells. The top cover substrate may be made from glass, whereas the bottom substrate may be made from glass or metal foil.

Example 4

Figure 11:
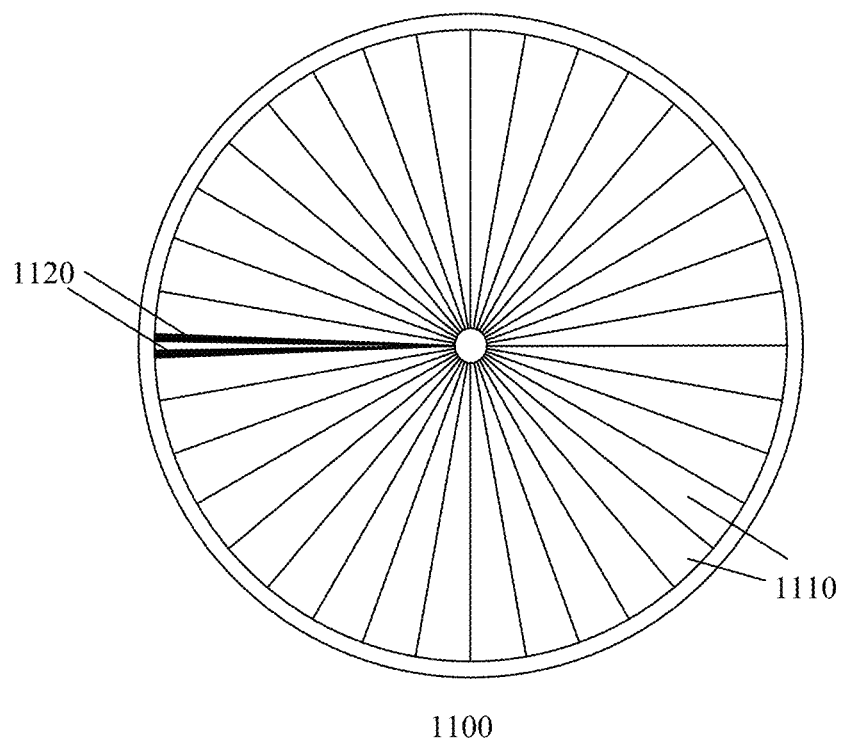
FIG. 11 shows another example of a failure-resistant thin-film photovoltaic module.

Another failure-resistant TFPV module 1100 may be produced as shown in FIG. 11, in which the shape of the module is round and its edges are curved. The PV cells 1110 may be based on CIGS, CdTe or a-Si alloys. The scribing pattern may be radial as shown in FIG. 11, so that each cell has a sector shape and has limited proximity to the edge of the module at one of its smaller sides. The module may be 10-200 cm in diameter and may contain 10-100 PV cells connected in series. The top and bottom substrate are laminated together to completely enclose the PV cells 1110, which may be deposited on either the top or the bottom substrate. The top cover substrate may be made from glass, whereas the bottom substrate may be made from glass or metal foil.

The invention claimed is:

1. A degradation-resistant photovoltaic device comprising:
   an active area having edges that are all straight; and
   a plurality of photovoltaic cells each having top and bottom contacts and photovoltaic material therebetween;
   a plurality of electrical edge contacts located within the active area, a first of the electrical edge contacts being electrically coupled to the top contact without directly contacting the photovoltaic material located in the each of the photovoltaic cells and a second of the electrical edge contacts being electrically coupled to the bottom contact without directly contacting the photovoltaic material located in each of the photovoltaic cells, each of said photovoltaic cells being separated from one another by scribing lines, said electrical edge contacts being connected to at least one of the cells and having a characteristic width and a characteristic length, wherein the characteristic length is greater than the characteristic width and an average distance from each and every of the electrical edge contacts to each and every edge of the active area is greater than its characteristic width, at least one of the scribing lines being completely filled with photovoltaic absorbing material or a conducting material which electrically connects a first of the photovoltaic cells to a second of the photovoltaic cells, wherein at least a portion of two scribing lines defining at least one of the photovoltaic cells are parallel to one another, the active area consisting of the photovoltaic material, the scribing lines, the photovoltaic absorbing material, the conducting material and the electrical edge contacts.

2. The photovoltaic device of claim 1 wherein at least two of said photovoltaic cells are connected electrically in series.

3. The photovoltaic device of claim 1 further comprising a first substrate and a second substrate wherein said plurality of photovoltaic cells are encapsulated between the first and second substrates.

4. The photovoltaic device of claim 1 wherein at least two of the scribing lines are parallel to one another.

5. The photovoltaic device of claim 1 wherein a first scribing line associated with a first photovoltaic cell and second scribing line associated with a second photovoltaic cell are perpendicular to one another.

6. The photovoltaic device of claim 1 in which at least one of the photovoltaic cells has a different shape from at least one other of the photovoltaic cells.

7. The photovoltaic device of claim 1 in which a first of the photovoltaic cells is a mirror image of a second of the photovoltaic cells.

8. The photovoltaic device of claim 6 in which the plurality of photovoltaic cells includes a first plurality of photovoltaic cells and a second plurality of photovoltaic cells, each of the photovoltaic cells in the first plurality of cells being a mirror image of one of the photovoltaic cells in the second plurality of photovoltaic cells.

9. A degradation-resistant photovoltaic device comprising:
   an active area and a plurality of photovoltaic cells located in the active area, all edges of the active area being straight, each of said photovoltaic cells being separated from one another by scribing lines, said photovoltaic cell having a characteristic width and a characteristic length, wherein the characteristic length is greater than the characteristic width and an average distance from each and every photovoltaic cell to each and every edge of the active area is greater than the characteristic width, at least one of the scribing lines being completely filled with photovoltaic absorbing material or a conducting material which electrically connects a first of the photovoltaic cells to a second of the photovoltaic cells, wherein at least one of the photovoltaic cells has a different shape from at least one other photovoltaic cell and the at least one of the photovoltaic cell and the at least one other photovoltaic cell have mirror-image asymmetry with respect to one another, the active area being dividable into two continuous portions equal in area such that an entirety of each of the photovoltaic cells is located entirely in one or the other of the two continuous portions of the active area, the photovoltaic cells in one of the two continuous portions collectively having mirror-image symmetry with respect to the photovoltaic cells in the other of the two continuous portions, the active area consisting of the photovoltaic material, the scribing lines, the photovoltaic absorbing material and the conducting material.

10. The degradation-resistant photovoltaic device of claim 1 wherein each of the electrical edge contacts have a rectangular shape.

11. The degradation-resistant photovoltaic device of claim 1 wherein each electrical edge contact has a pair of shorter sides and a pair of longer sides, the pair of shorter sides being parallel to an edge of the active area to which it is in closest proximity.

12. The degradation-resistant photovoltaic device of claim 1 wherein each electrical edge contact has a pair of shorter sides and a pair of longer sides, the pair of shorter sides defining an oblique angle with respect an edge of the active area to which it is in closest proximity.

13. The degradation-resistant photovoltaic device of claim 1 wherein each electrical edge contact has a longest side that is perpendicular to an edge of the active area to which it is in closest proximity.

14. The degradation-resistant photovoltaic device of claim 1 wherein each electrical edge contact has a longest side that is at angle of more than 0° and less than 90° with respect to an edge of the active area to which it is in closest proximity.

15. The degradation-resistant photovoltaic device of claim 1 wherein the plurality of electrical edge contacts includes a first plurality of electrical edge contacts and a second plurality of electrical edge contacts, each of the electrical edge contacts in the first plurality being electrically connected to one another in series and each of the electrical edge contacts in the second plurality being electrically connected to one another in series.

16. The degradation-resistant photovoltaic device of claim 15 wherein a pair of electrical edge contacts in the first plurality of electrical edge contacts respectively define first and second oblique angles with respect to an edge of the active area to which they are in closest proximity, the first and second oblique angles being oppositely oriented with respect to a common axis, the first and second angles being equal in magnitude to one another.

17. The degradation-resistant photovoltaic device of claim 1 wherein each of said photovoltaic cells has a characteristic width and a characteristic length, wherein the characteristic length is greater than the characteristic width and an average distance from each and every photovoltaic cell to each and every edge of the active area is greater than the characteristic width.

18. The degradation-resistant photovoltaic device of claim 17 wherein at least one of the photovoltaic cells is shaped as a nonrectangular parallelogram.

19. The degradation-resistant photovoltaic device of claim 17 wherein each of the photovoltaic cells is shaped as a nonrectangular parallelogram.

* * * * *